United States Patent [19]

Crump et al.

[11] Patent Number: 5,385,759
[45] Date of Patent: Jan. 31, 1995

[54] SUBSTRATE COATING METHODS AND APPARATUS

[75] Inventors: David P. Crump, Pittsford; Edward C. Williams, Palmyra, both of N.Y.

[73] Assignee: Xerox Corporation, Stamford, Conn.

[21] Appl. No.: 143,703

[22] Filed: Nov. 1, 1993

[51] Int. Cl.⁶ .............................................. B05D 1/18
[52] U.S. Cl. ................... 427/430.1; 118/404; 118/405; 118/407; 118/423; 118/DIG. 11
[58] Field of Search ............... 427/430.1; 118/404, 118/405, 407, 423, DIG. 11

[56] References Cited

U.S. PATENT DOCUMENTS

| | | | |
|---|---|---|---|
| 2,783,734 | 3/1957 | Fisch et al. | 118/404 |
| 3,209,723 | 10/1965 | Schrödersecker | 118/404 |
| 3,689,311 | 9/1972 | Loeffler et al. | 118/DIG. 11 |
| 5,105,936 | 4/1992 | Stapper et al. | 198/834 |
| 5,186,477 | 2/1993 | Nakazawa et al. | 279/2.09 |

Primary Examiner—Shrive Beck
Assistant Examiner—David M. Maiorana
Attorney, Agent, or Firm—Zosan S. Soong

[57] ABSTRACT

There are disclosed apparatus and substrate coating methods comprising: (a) positioning a first coupler comprised of a tapered end portion in an opening of a reservoir apparatus to define a reservoir for a coating solution between the surfaces of the first coupler and the reservoir apparatus, wherein the tapered end portion of the first coupler extends below the opening; (b) engaging the bottom end of a vertically disposed, hollow substrate with a first end portion of a second coupler comprised of the first end portion and an opposed, tapered second end portion; (c) moving the top end of the substrate over a part of the tapered end portion of the first coupler to engage the substrate with the first coupler, and moving the first coupler and the substrate through the opening, whereby the coating solution is deposited on the outer surface of the substrate; (d) positioning the second coupler in the opening to define the reservoir, wherein the tapered second end portion of the second coupler extends below the opening; and (e) adding the coating solution to the reservoir at any suitable time.

13 Claims, 4 Drawing Sheets

SUBSTRATE COATING METHODS AND APPARATUS

This invention relates generally to substrate coating methods and apparatus. More particularly, the invention pertains to methods and apparatus for the coating of layered material on a substrate in the fabrication of photosensitive or photoconductive members.

In the fabrication of photoreceptors, layered material maybe be coated onto a substrate by employing an elevating coating apparatus which may be considered a type of a dip coating apparatus. Straight sided cylindrical couplers may be employed to engage the substrates to guide them through the elevating coater, but their use is problematic. For example, straight sided cylindrical couplers may become tilted in the gasket of the elevating coater, necessitating manual intervention to align the end of the coupler and the top of the substrate, and thereby decreasing productivity. Manual intervention, however, may be dangerous to the hands of the human operator. Also, the straight sides of the coupler which define a straight leading edge, over time, may damage the gasket of the elevating coater since there is no smooth lead in to favor the sealing edge of the gasket.

Nakazawa et al., U.S. Pat. No. 5,186,477, discloses a chucking device for chucking a drum to keep it vertical while the drum is immersed in a coating liquid.

Stapper et al., U.S. Pat. No. 5,105,936, discloses a chain-drum mechanism wherein the document states in col. 3, lines 1-3, that "conical surfaces constitute guide surfaces that make dismantling of the assembly unit from the machine frame easier."

SUMMARY OF THE INVENTION

It is an object of the present invention to provide methods and apparatus for guiding substrates through a elevating coating apparatus which minimizes operator intervention to align the substrate and the coupler.

It is another object to provide couplers having tapered surfaces which constitute substrate guide surfaces.

It is a further object in embodiments to provide couplers which minimize damage to the gasket.

These objects and others are accomplished in embodiments by providing a substrate coating method comprising:

(a) positioning a first coupler comprised of a tapered end portion in an opening of a reservoir apparatus to define a reservoir for a coating solution between the surfaces of the first coupler and the reservoir apparatus, wherein the tapered end portion of the first coupler extends below the opening;

(b) engaging the bottom end of a vertically disposed, hollow substrate with a first end portion of a second coupler comprised of the first end portion and an opposed, tapered second end portion;

(c) moving the top end of the substrate over a part of the tapered end portion of the first coupler to engage the substrate with the first coupler, and moving the first coupler and the substrate preferably completely through the opening, whereby the coating solution is deposited on the outer surface of the substrate;

(d) positioning the second coupler in the opening to define the reservoir, wherein the tapered second end portion of the second coupler extends below the opening; and (e) adding the coating solution to the reservoir at any suitable time.

In additional embodiments, there is provided a substrate coating method comprising:

(a) engaging one end of a vertically disposed, hollow substrate with a first end portion of a first coupler, wherein the first coupler has an unengaged, tapered second end portion;

(b) engaging the other end of the substrate with a first end portion of a second coupler, wherein the second coupler has an opposed tapered second end portion;

(c) moving the first coupler through an opening of a reservoir apparatus, wherein the tapered second end portion is the leading edge, and moving the substrate through the opening of the reservoir apparatus; and (d) positioning the second coupler in the opening, wherein a part of the tapered second end portion of the second coupler extends below the opening to provide a guide surface to facilitate engagement of the second coupler with an end of a second substrate.

There is also provided in embodiments a substrate coating apparatus comprising:

(a) a reservoir apparatus;

(b) a first coupler, disposed beneath the reservoir apparatus, comprised of a first end portion and an opposed, tapered second end portion, wherein the second end portion includes a substrate engaging surface;

(c) a vertically disposed, hollow, cylindrical substrate engaged with the engaging surface of the first coupler wherein a part of the tapered second end portion of the first coupler is disposed inside the substrate through the top end of the substrate; and (d) a second coupler comprised of a first end portion and an opposed, tapered second end portion, wherein the first end portion includes a substrate engaging surface that is engaged with the bottom end of the substrate.

There is further provided in embodiments a substrate coating apparatus comprising:

(a) a reservoir apparatus comprised of an opening;

(b) a first coupler, disposed in the opening, comprised of a first end portion and an opposed, tapered second end portion, wherein the second end portion includes a substrate engaging surface, and wherein a part of the tapered second end portion extends below the opening;

(c) a vertically disposed, hollow, cylindrical substrate disposed beneath the first coupler; and (d) a second coupler comprised of a first end portion and an opposed, tapered second end portion, wherein the first end portion includes a substrate engaging surface that is engaged with the bottom end of the substrate.

BRIEF DESCRIPTION OF THE DRAWINGS

Other aspects of the present invention will become apparent as the following description proceeds and upon reference to the Figures which represent preferred embodiments (the same reference numerals refer to the same or similar components).

DETAILED DESCRIPTION

Figure 1:
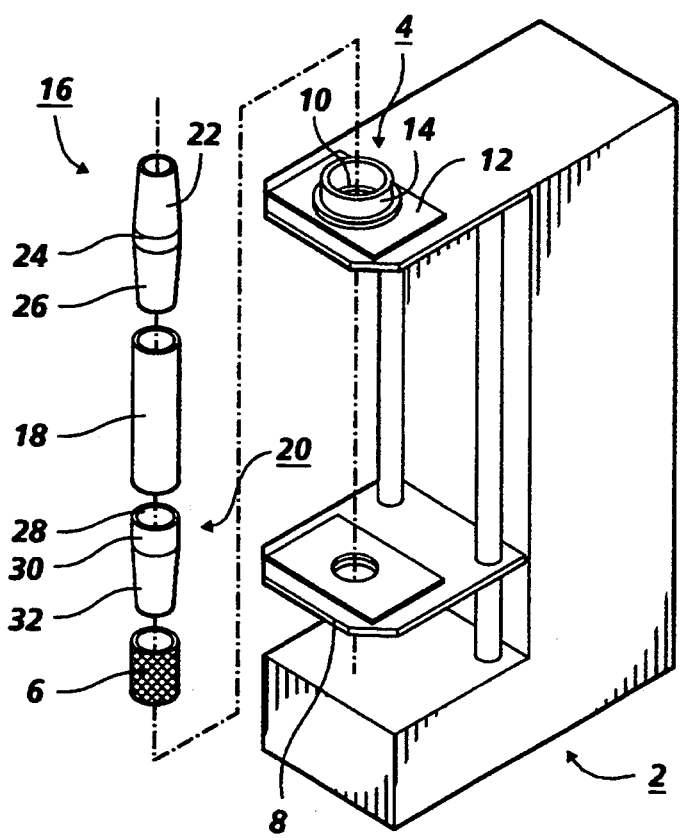
FIG. 1 is an elevational, schematic illustration of the elevating coating apparatus with also an elevational, exploded view of the component order for the couplers and optional pushing collar employed to guide the substrate through the elevating coating apparatus.

In FIG. 1, elevating coating apparatus 2 is comprised of reservoir apparatus 4, pushing collar 6, and vertically movable stage 8. Reservoir apparatus 4 includes opening 10, base 12, open ended coating head 14 having a brim, and a gasket defining the edge of opening 10 disposed between base 12 and coating head 14, wherein opening 10 extends through base 12, the gasket, and coating head 14. Pushing collar 6 is positioned directly under reservoir apparatus 4 and is preferably removably coupled to stage 8 by for example fastening devices such as screws, and the like.

FIG. 1 depicts the component order during engagement of first coupler or starting coupler 16, substrate 18, second or cycling coupler 20, and pushing collar 6. First coupler 16 comprises first end portion 22, which may be tapered in embodiments, central portion 24, and tapered second end portion 26. At least a part of tapered second end portion 26 is sized to slip into the end of substrate 18. To enable substrate 18 to engage first coupler 16, second end portion 26 is provided with a substrate engaging surface which may be an outer cross sectional dimension of the second end portion sized to engage the interior surface of the substrate 18, a seating surface to engage an end edge of substrate 18, or both. Preferably, the substrate engaging surface is located at the base of second end portion 26, adjacent central portion 24. For example, the second end portion 26 may be recessed as compared with the central portion 24 to provide the seating surface. First end 22 of first coupler 16 may be tapered to provide a smooth lead in to minimize damage to the sealing edge of the gasket. Although first end 22 and second end 26 of first coupler 16 may be different in dimensions and configuration from each other, first end 22 add second end 26 preferably have the same dimensions and configuration.

Second or cycling coupler 20 comprises first end portion 28, central portion 30, and tapered second end portion 32. First end portion 28 may be provided with a recessed rim having a seating surface to engage an end edge of substrate 18. The rim preferably engages the interior surface of substrate 18 to provide stability to the substrate during substrate movement. The second end portion 32 preferably has the same or similar dimensions and configuration as the second end portion 26 of first coupler 16 since the second end portion 32 of second coupler 20 may engage an end of another substrate during the coating of multiple substrates. To enable a substrate to engage second coupler 20, second end portion 32 may be provided with a substrate engaging surface which may be an outer cross sectional dimension of second end portion 32 sized to engage the interior surface of the substrate, a seating surface to engage an end edge of the substrate, or both. Preferably, the substrate engaging surface is located at the base of second end portion 32, adjacent central portion 30. For example, the second end portion 32 may be recessed as compared with the central portion 30 to provide the seating surface.

Pushing collar 6 is hollow and is sized to receive in its interior a part, preferably the entire length, of second end portion 32 of second coupler 20. Pushing collar 6 is preferably present since it steadies the movement of substrate 18 and second coupler 20.

Figure 2:
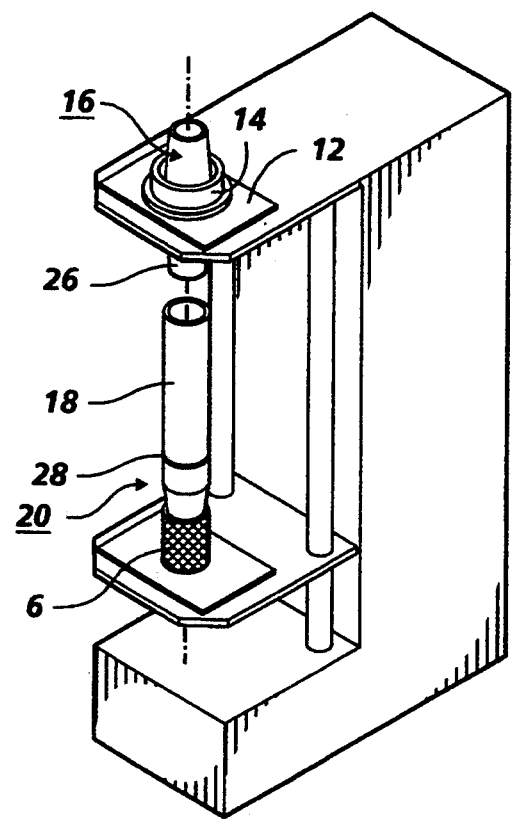
FIG. 2 is an elevational, schematic illustration of the elevating coating apparatus, the first coupler, a substrate, the second coupler (also referred herein as a cycling coupler), and the pushing collar prior to coating of the substrate.

In FIG. 2, first coupler 16 is manually moved into position in opening 10 to define a preferably sealed reservoir between the outer surfaces of first coupler 16 and the inner surfaces of coating head 14 and the gasket (not shown). A part of tapered second end portion 26, such as from about 1/5 to about ½ the coupler length, extends below opening 10. Preferably, the entire second end portion 26 extends below opening 10. A coating solution is added to the reservoir. The coating solution may be added to the reservoir at any suitable time, preferably before movement of substrate 18 through opening 10. Second coupler 20 is disposed in pushing collar 6 and the bottom end of substrate 18 is engaged with first end 28 of second coupler 20. At this time, the top end of substrate 18 is spaced from and directly below second end portion 26 of first coupler 16.

In an alternate embodiment, first or starting coupler 16 may be moved into position in opening 10 by having starting coupler 16 engage with the top end of substrate 18 and the movement of stage 8 moves the engaged components of starting coupler 16, substrate 18, second coupler 20, and pushing collar 6 vertically towards and into opening 10. Stage 8 terminates movement when starting coupler 16 is positioned into opening 10.

Figure 3:
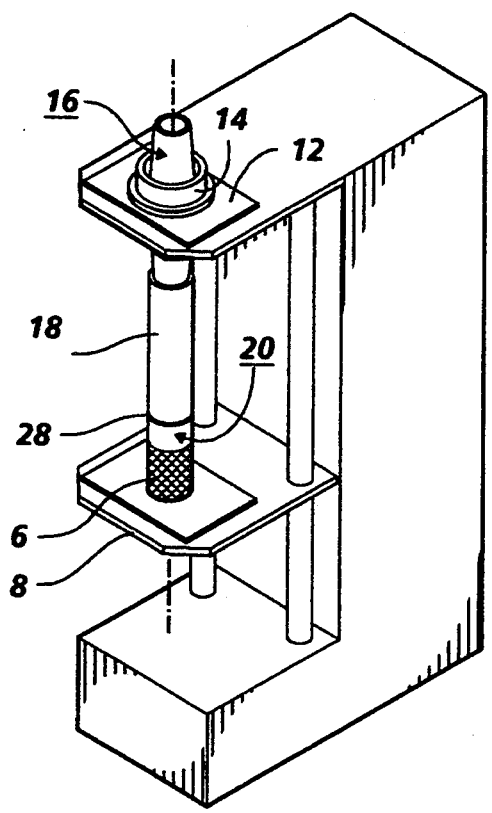
FIG. 3 is an elevational, schematic illustration of the elevating coating apparatus wherein the substrate engages the first coupler.

In FIG. 3, stage 8 is elevated upwards to move top end of substrate 18 over tapered second end portion 26 to engage first coupler 16.

Figure 4:
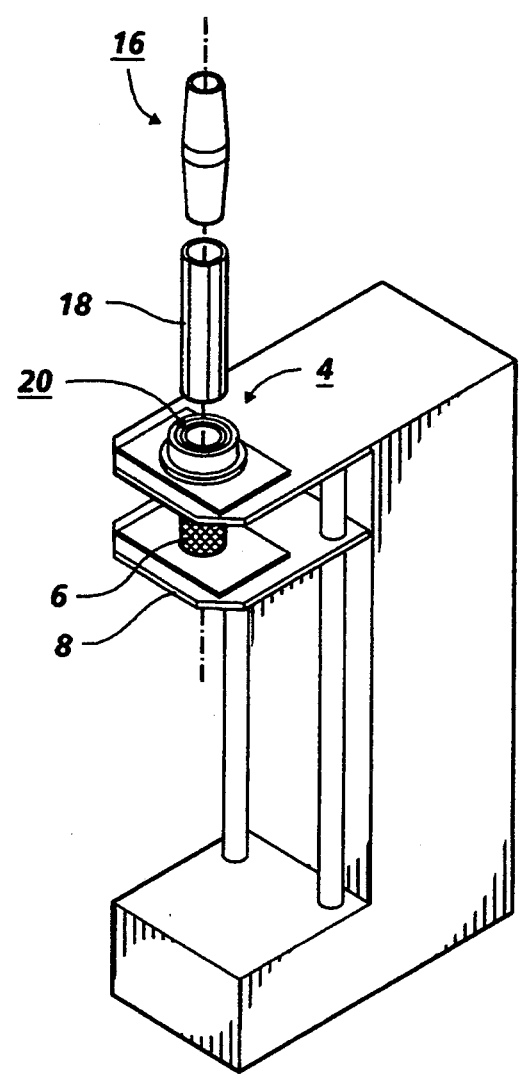
FIG. 4 is an elevational, schematic illustration of the elevating coating apparatus with a partial exploded view of the first coupler, the coated substrate, and the second coupler subsequent to coating of the substrate.

In FIG. 4, continued movement of stage 8 upwards pushes first coupler 16 and substrate 8 completely through reservoir apparatus 4, whereby a layer of the coating solution is deposited on the outer surface of substrate 18 as it travels through opening 10 and is exposed to the coating solution. Movement of second coupler 20 through opening 10 is stopped by for example a limit switch (not shown). Contact of the encircling gasket (not shown) against the surface of first coupler 16 seals the reservoir to sustain the coating solution in the reservoir. In embodiments, movement of second coupler 20 may be stopped for example when the gasket contacts the surface of central portion 30 (not shown). Preferably, movement of second coupler 20 is stopped when the lip of second coupler 20 extends above the coating head 14.

Figure 5:
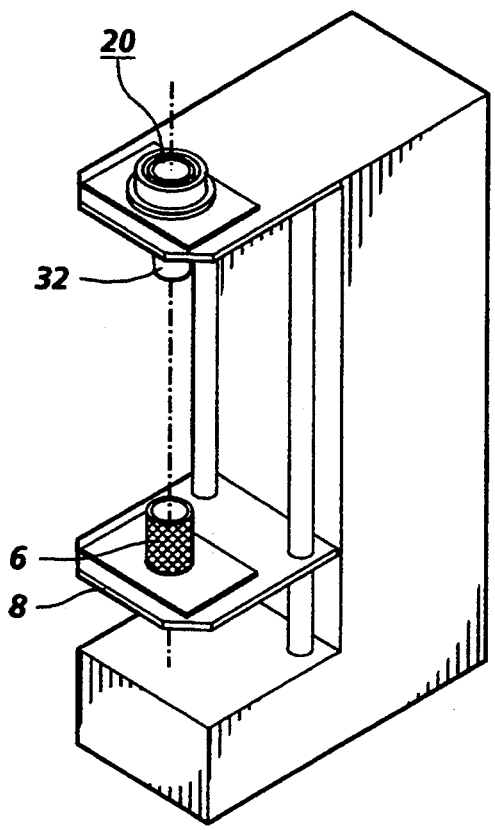
FIG. 5, is an elevational, schematic illustration of the elevating coating apparatus with the second coupler and the pushing collar.

In FIG. 5, stage 8 with pushing collar 6 is returned to home position. A part of tapered second end portion 32 of second coupler 20, such as from about 1/5 to about ¼ the coupler length, extends below opening 10 (not shown). Preferably, the entire second end portion 32 extends below opening 10.

Figure 6:
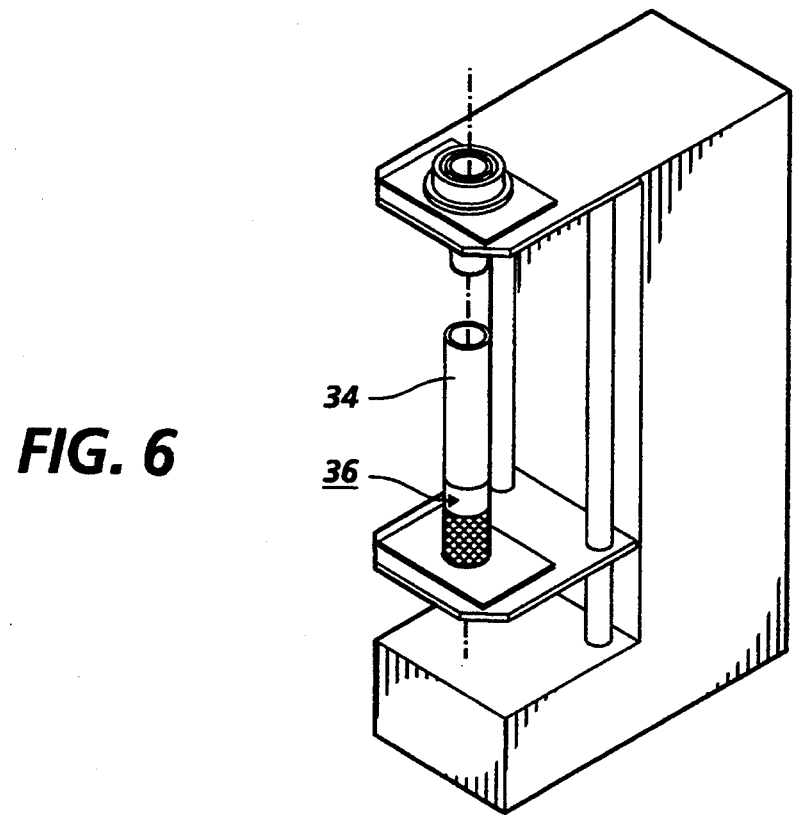
FIG. 6 is an elevational, schematic illustration of the elevating coating apparatus with the second coupler, a second substrate, another cycling coupler, and the pushing collar.

In FIG. 6, second substrate 34 and third or alternate cycling coupler 36 are loaded onto pushing collar 6. Third coupler 36 preferably has the same dimensions and configuration as second coupler 20 and thus third coupler 36 has a first end portion, a central portion, and a tapered second end portion.

Figure 7:
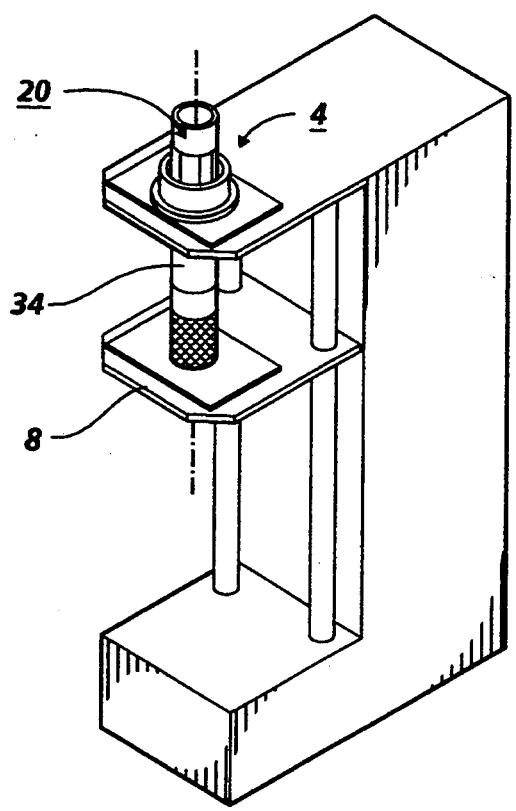
FIG. 7 is an elevational, schematic illustration of the elevating coating apparatus depicting coating of the second substrate.

In FIG. 7, stage 8 is elevated upwards to move top end of second substrate 34 over tapered second end portion 26 (not shown) of second coupler 20 to engage second coupler 20. Movement of stage 8 pushes second coupler 20 through reservoir apparatus 4 and a coated portion of second substrate 34 emerges.

Figure 8:
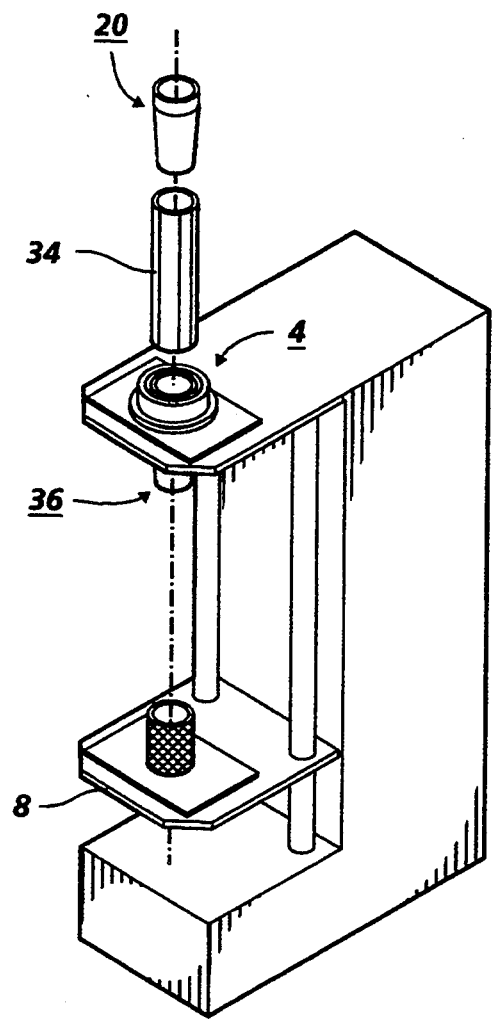
FIG. 8 is an elevational, schematic illustration of the elevating coating apparatus with a partial exploded view of the two cycling couplers and the coated second substrate.

In FIG. 8, second substrate 34, now coated, and second coupler 20 are pushed completely through reservoir apparatus 4. Movement of third coupler 36 through opening 10 (not shown) is stopped by for example a limit switch (not shown). Contact of the encircling gasket (not shown) against the surface of third coupler 36 seals the reservoir to sustain the coating solution in the reservoir. In embodiments, movement of third coupler 36 may be stopped for example when the gasket contacts the surface of the central portion of the third coupler 36. Stage 8 is returned to the home position. A part of the tapered second end portion of third coupler 36, such as from about 1/5 to about ¼ the coupler length, extends below opening 10 (not shown). Preferably, the entire second end portion of third coupler 36 extends below opening 10.

After the substrates have been coated by embodiments of the present invention, the substrates may undergo further fabrication steps such as for example drying and the coating of additional layers. The various couplers may be cleaned, such as by cleaning the coupler surfaces with an appropriate solvent like methylene chloride, and reused.

The opening 10 is of any effective size and shape to accommodate passage of the couplers and the substrates. For example, the opening may be circular or oval and may range in size from about 2 to about 50 cm. Preferably, the opening is sized to provide a seal between each coupler and the gasket edge.

The gasket defining the edge of the opening may be of any effective design and may be fabricated of any suitable material including for example plastic or rubber. The gasket has an effective thickness ranging for example from about 1 ml to about 1 cm. Preferably, the gasket is in the form of a sheet having a circular opening.

Although the Figures illustrate the use of two types of couplers (first coupler 16 being of one type which may be called a starting coupler, and second and third couplers (20,36) being the second type which may be called a cycling coupler), the present invention in embodiments may use exclusively only one type of coupler, i.e. either the starting coupler or the cycling couplers. Any suitable number of starting and/or cycling couplers may be used such as one, two, three, or more. A preferred coating method employs one starting coupler and two cycling couplers. The taper employed on end portions of the couplers provides a guide surface to facilitate alignment of the substrate so as to minimize or eliminate operator intervention during movement of the substrate into the reservoir apparatus. A preferred shape for the tapered end portions of the couplers is a cone shape having a flattened end. The various couplers (16,20,36) may have the same or different dimensions and configurations from one another. For example, the end portions of the cycling couplers (20,36) may be the same or different in dimensions and configuration from one another. Furthermore, the tapered end portions of the starting coupler may have the same or different dimensions and configuration from the tapered end portion of the cycling couplers.

Each coupler may have the following preferred dimensions: an overall length ranging for example from about 5 to about 50 cm; a tapered end portion length ranging for example from about 3 cm to about 20 cm; a center portion length ranging for example from about 1 to about 20 cm; a cross sectional dimension ranging for example from about 3 to about 50 cm; and a rim length for the cycling couplers ranging for example from about 3 to about 10 cm. The tapered end portion has an effective taper for providing a substrate guide surface, the taper preferably ranging from about 0.1 mm to about 1 mm per mm of tapered component length. The couplers may be fabricated of any suitable material including a plastic such as DELRIN ™ available from Dupont and a metal such as stainless steel, aluminum, iron, nickel, and copper. The couplers may be hollow, partially hollow, or solid. Preferably, the couplers are hollow to prevent their weight from pulling them out of the gasket.

The substrate is preferably uncoated before passage through the elevating coater, but may be previously coated with layered material. The substrate may be of any effective cross sectional shape including oval and circular. Preferably, the substrate is cylindrical and has the following preferred dimensions: a length ranging for example from about 5 to about 70 cm; a wall thickness ranging for example from about 0.3 ml to about 3 cm; and an interior cross sectional dimension ranging for example from about 2 to about 50 cm. The substrate may be fabricated from for example stainless steel, nickel, aluminum, copper, and iron.

The coating solution is applied as a layer in an effective thickness on the substrate surface, wherein the deposited layer ranges in thickness for example from about 1 micron to about 1 ml. The coating solution may comprise any suitable liquid including solutions typically employed to coat layered material on the substrate during fabrication of photosensitive or photoconductive members. For example, the coating solution may comprise components for the charge transport layer and/or the charge generating layer, such components and amounts thereof being illustrated for instance in U.S. Pat. Nos. 4,265,990, 4,390,611, 4,551,404, 4,588,667, 4,596,754, and 4,797,337, the disclosures of which are totally incorporated by reference. In embodiments, the coating solution may be formed by dispersing a charge generating material selected from azo pigments such as Sudan Red, Dian Blue, Janus Green B, and the like; quinone pigments such as Algol Yellow, Pyrene Quinone, Indanthrene Brilliant Violet RRP, and the like; quinocyanine pigments; perylene pigments; indigo pigments such as indigo, thioindigo, and the like; bisbenzoimidazole pigments such as Indofast Orange toner, and the like; phthalocyanine pigments such as copper phthalocyanine, aluminochloro-phthalocyanine, and the like; quinacridone pigments; or azulene compounds in a binder resin such as polyester, polystyrene, polyvinyl butyral, polyvinyl pyrrolidone, methyl cellulose, polyacrylates, cellulose esters, and the like. In embodiments, the coating solution may be formed by dissolving a charge transporting material selected from compounds having in the main chain or the side chain a polycyclic aromatic ring such as anthracene, pyrene, phenanthrene, coronene, and the like, or a nitrogen-containing hetero ring such as indole, carbazole, oxazole, isoxazole, thiazole, imidazole, pyrazole, oxadiazole, pyrazoline, thiadiazole, triazole, and the like, and hydrazone compounds in a resin having a film-forming property. Such resins may include polycarbonate, polymethacrylates, polyarylate, polystyrene, polyester, polysulfone, styrene-acrylonitrile copolymer, styrene-methyl methacrylate copolymer, and the like.

The coating solution may also comprise materials typically employed as a subbing layer, barrier layer, adhesive layer, and the like. Accordingly, the coating solution may comprise, for example, casein, polyvinyl alcohol, nitrocellulose, ethyleneacrylic acid copolymer, polyamide (nylon 6, nylon 66, nylon 610, copolymerized nylon, alkoxymethylated nylon, and the like), polyurethane, gelatin, polyester, polyvinylbutyral, polyvinylpyrrolidone, polycarbonate, polyurethane, polymethyl methacrylate, and the like as well as mixtures thereof.

The following is a preferred embodiment of the present invention. The present invention pertains to apparatus and methods for guiding substrates, especially photoreceptor substrates, through an elevating coater apparatus which minimizes operator intervention and prolongs the life of the sealing edge of the critical gasket component. The novel apparatus of this invention are referred to by name as: starting coupler; cycling coupler; and pushing collar. Other described components are parts typically employed in the elevating coater.

The starting coupler is an appropriately dimensioned cylinder featuring a taper at each end. The top, or leading taper, leads into the parallel portion of the cylinder with a smooth, unbroken curve. The bottom, or following taper, leads into a lesser diameter than the parallel portion of the cylinder to produce a step on which to position the substrate to be coated. The substrate to be coated has an outside diameter which matches the outside diameter of the parallel portion of the cylinder.

The cycling coupler is an appropriately dimensioned cylinder featuring a taper at one end only. The taper will be a bottom, following taper matching the description of the following taper of the starting coupler. The other end of the cylinder will feature a step corresponding to the step on the following end, but with no taper.

The pushing collar is preferably a heavier cylinder for stability, and is machined at the top end to accommodate the following taper of the cycling coupler plus having a counterbored end section to appropriately seat on the step in the same manner as the substrate. The bottom end is preferrably machined with a step to fit snugly and squarely into a plate mounted on the movable stage.

The substrate coating method which is improved by using the above described fixtures may be put into practice by using the following steps:

(a) with the stage of the elevating coater in the down position, the pushing collar is mounted on the stage; insert taper of one cycling coupler into top of pushing collar and seat securely; mount substrate to be coated on to the step at top of cycling coupler; now insert the bottom taper of the starting coupler into the top of the substrate and seat on the step completely.

(b) activate the jog switch, which moves the assembled stack upward through the gasket mounted under the coating head until the bottom of the leading taper is flush with the top of the coating head. An annular reservoir is now defined which sustains a coupler for the inner wall, a gasket bottom, and the coating head for the outer wall.

(c) coating solution is now added to the reservoir.

(d) activate an electrical switch to elevate the stage, thereby causing the substrate to be pushed entirely through the gasket and allowing it to become coated with the solution to which it is exposed. The cycle will stop the travel when the top lip of the cycling coupler is flush with the top of the coating head.

(e) the starting coupler is removed for cleaning.

(f) the coated substrate is removed for drying.

(g) the solution level is topped off.

(h) the stage with pushing collar in place is returned to bottom or home position.

Subsequent coating may be accomplished with the following steps: (i) insert a second cycling coupler into the top of the pushing collar; (j) mount a substrate on the top of the second cycling coupler; (k) repeat (d) as described above to push through the cycling coupler, previously positioned in the reservoir apparatus and to position the second cycling coupler in the reservoir apparatus; and (I) at cycle completion, remove cycling coupler for cleaning, remove coated substrate for drying, check solution level, and repeat steps for desired number of photoreceptors. The dimensions of all parts are relative to the desired coated product, the desired size of the reservoir, and the cycle travel definition.

Other modifications of the present invention may occur to those skilled in the art based upon a reading of the present disclosure and these modifications are intended to be included within the scope of the present invention.

We claim:

1. A substrate coating method comprising:
    (a) positioning a first coupler comprised of a tapered first end portion and an opposed, tapered second end portion in an opening of a reservoir apparatus to define a reservoir for a coating solution between the surfaces of the first coupler and the reservoir apparatus, wherein the tapered second end portion of the first coupler extends below the opening;
    (b) engaging the bottom end of a vertically disposed, hollow substrate with a first end portion including a recessed rim of a second coupler comprised of the first end portion and an opposed, tapered second end portion;
    (c) moving the top end of the substrate over a part of the tapered second end portion of the first coupler to engage the substrate with the first coupler, and moving the first coupler and the substrate through the opening, whereby the coating solution is deposited on the outer surface of the substrate;
    (d) positioning the second coupler in the opening to define the reservoir, wherein the tapered second end portion of the second coupler extends below the opening; and
    (e) adding the coating solution to the reservoir at any suitable time.

2. The method of claim 1, wherein (a) comprises positioning the first coupler in an opening ringed by a gasket.

3. The method of claim 1, wherein (a) comprises positioning the first coupler in the opening to seal the reservoir.

4. The method of claim 1, wherein (d) comprises positioning the second coupler in the opening to seal the reservoir.

5. The method of claim 1, further comprising (f) positioning a pushing collar over the tapered second end portion of the second coupler to engage the second coupler.

6. The method of claim 1, wherein the movement of the substrate in (c) is effected by positioning the second coupler and the substrate on a movable stage and moving the stage vertically.

7. The method of claim 1, wherein the first end portion of the second coupler is comprised of a recessed rim including a seating surface, and (b) comprises contacting the bottom edge of the substrate with the seating surface, whereby the rim engages the interior surface of the substrate.

8. The method of claim 1, further comprising positioning the top end of the substrate directly below the tapered second end portion of the first coupler.

9. The method of claim 1, wherein (e) comprises adding the coating solution to the reservoir prior to (c).

10. The method of claim 1, wherein the substrate is cylindrically shaped.

11. A substrate coating method comprising:
(a) engaging one end of a vertically disposed, hollow substrate with a tapered first end portion of a first coupler, wherein the first coupler has an unengaged, tapered second end portion;
(b) engaging the other end of the substrate with a first end portion including a recessed rim of a second coupler, wherein the second coupler has an opposed tapered second end portion;
(c) moving the first coupler through an opening of a reservoir apparatus, wherein the tapered second end portion is the leading edge, and moving the substrate through the opening of the reservoir apparatus; and
(d) positioning the second coupler in the opening, wherein a part of the tapered second end portion of the second coupler extends below the opening to provide a guide surface to facilitate engagement of the second coupler with an end of a second substrate.

12. Substrate coupling apparatus comprising:
(a) a first coupler comprised of a tapered first end portion and an opposed, tapered second end portion; and
(b) a second coupler comprised of a first end portion including a recessed rim and an opposed, tapered second end portion.

13. The apparatus of claim 12, wherein the first coupler and the second coupler are hollow.

* * * * *